(12) United States Patent
Murase et al.

(10) Patent No.: US 11,239,159 B2
(45) Date of Patent: Feb. 1, 2022

(54) SEMICONDUCTOR DEVICE

(71) Applicant: Murata Manufacturing Co., Ltd., Nagaokakyo (JP)

(72) Inventors: Yasuhiro Murase, Nagaokakyo (JP); Tomoyuki Ashimine, Nagaokakyo (JP); Hiroshi Nakagawa, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 133 days.

(21) Appl. No.: 15/931,816

(22) Filed: May 14, 2020

(65) Prior Publication Data

US 2020/0273796 A1 Aug. 27, 2020

Related U.S. Application Data

(63) Continuation of application No. PCT/JP2018/047719, filed on Dec. 26, 2018.

(30) Foreign Application Priority Data

Dec. 28, 2017 (JP) .............................. JP2017-254518

(51) Int. Cl.
*H01L 23/522* (2006.01)
*H01L 27/02* (2006.01)
(Continued)

(52) U.S. Cl.
CPC ...... *H01L 23/5228* (2013.01); *H01L 23/5222* (2013.01); *H01L 23/5227* (2013.01);
(Continued)

(58) Field of Classification Search
CPC .. H01L 23/5228; H01L 23/5222; H01L 28/40
See application file for complete search history.

(56) References Cited

U.S. PATENT DOCUMENTS

2007/0274014 A1* 11/2007 Berberich ............. H01L 23/642
                                                          361/91.7
2011/0001217 A1*  1/2011 Neuilly ................ H01L 23/481
                                                          257/532
(Continued)

FOREIGN PATENT DOCUMENTS

JP          S628550 A        1/1987
JP          S63213956 A      9/1988
(Continued)

OTHER PUBLICATIONS

International Search Report Issued for PCT/JP2018/047719, dated Feb. 5, 2019.

(Continued)

*Primary Examiner* — Omar F Mojaddedi
(74) *Attorney, Agent, or Firm* — Arent Fox LLP

(57) ABSTRACT

A semiconductor device that includes a semiconductor substrate having a first main surface and a second main surface, a first electrode opposing the first main surface of the semiconductor substrate, a dielectric layer between the semiconductor substrate and the first electrode, a first resistance control layer on the first electrode, a wiring part on the first resistance control layer, and a second electrode opposing the second main surface of the semiconductor substrate. The first resistance control layer includes a first region that has a first electrical resistivity and that electrically connects the first electrode and the wiring part, and a second region that is aligned with the first region and has a second electrical resistivity higher than the first electrical resistivity of the first region.

22 Claims, 13 Drawing Sheets

(51) Int. Cl.
- *H01L 29/94* (2006.01)
- *H01L 27/06* (2006.01)
- *H01L 49/02* (2006.01)

(52) U.S. Cl.
CPC ......... *H01L 27/0203* (2013.01); *H01L 28/10* (2013.01); *H01L 28/20* (2013.01); *H01L 28/40* (2013.01)

(56) References Cited

U.S. PATENT DOCUMENTS

| | | | | |
|---|---|---|---|---|
| 2014/0374879 | A1* | 12/2014 | Chen | H01L 28/40 257/532 |
| 2015/0145104 | A1* | 5/2015 | Bauer | H01L 28/60 257/534 |

FOREIGN PATENT DOCUMENTS

| | | |
|---|---|---|
| JP | H11195751 A | 7/1999 |
| JP | 201316730 A | 1/2013 |
| JP | 5476747 B2 | 4/2014 |

OTHER PUBLICATIONS

Written Opinion of the International Searching Authority issued for PCT/JP2018/047719, dated Feb. 5, 2019.

* cited by examiner

SEMICONDUCTOR DEVICE

CROSS REFERENCE TO RELATED APPLICATIONS

The present application is a continuation of International application No. PCT/JP2018/047719, filed Dec. 26, 2018, which claims priority to Japanese Patent Application No. 2017-254518, filed Dec. 28, 2017, the entire contents of each of which are incorporated herein by reference.

FIELD OF THE INVENTION

The present invention relates to a semiconductor device including a capacitor part and a resistor part.

BACKGROUND OF THE INVENTION

A semiconductor device having a capacitor part and a resistor part includes, for example, a semiconductor substrate doped with impurities, a dielectric layer formed on a first main surface of the semiconductor substrate, a first conductive electrode formed on the dielectric layer, and a second conductive electrode formed on a second main surface of the semiconductor substrate. At this time, since an electrical resistance of the semiconductor substrate is higher than electrical resistances of the first electrode and the second electrode, the semiconductor substrate functions as a resistor part, and the dielectric layer functions as a capacitor part that forms an electrostatic capacitance. The electrical resistance of the resistor part is established by dimensions of the semiconductor device, that is, an area and a thickness of the semiconductor substrate. Thus, it is difficult to design the semiconductor device as a semiconductor circuit having an appropriate electrostatic capacitance and electrical resistance.

For example, Patent Document 1 discloses a semiconductor device that includes a semiconductor substrate that includes a first resistance region connected directly below a capacitor part, a peripheral resistance region arranged in parallel with the first resistance region, and a resistance separation region having a resistance value equal to or higher than a resistance value of the first resistance region between the first resistance region and the peripheral resistance region. The resistance of the resistance separation region is increased by implanting ions into the semiconductor substrate and deteriorating crystallinity. The semiconductor device described in Patent Document 1 can change the electrical resistance of the resistor part by controlling the resistance value of the resistance separation region and controlling a volume ratio between the first resistance region and the resistance separation region. That is, a degree of freedom in designing a circuit of the semiconductor device can be improved.

Patent Document 1: Japanese Patent No. 5476747

SUMMARY OF THE INVENTION

However, in the semiconductor device described in Patent Document 1, when the ions are implanted into the resistance separation region, since high implantation energy is required to uniformly increase the resistance of the semiconductor substrate in a thickness direction, there is a problem that it is difficult to control the resistance value.

The present invention has been made in view of such circumstances, and an object of the present invention is to provide a semiconductor device capable of improving a degree of freedom in designing a circuit.

A semiconductor device according to an aspect of the present invention includes a semiconductor substrate that has a first main surface and a second main surface, a first electrode opposing the first main surface of the semiconductor substrate, a dielectric layer between the semiconductor substrate and the first electrode, a first resistance control layer on the first electrode, a wiring part on the first resistance control layer, and a second electrode opposing the second main surface of the semiconductor substrate. The first resistance control layer includes a first region that has a first electrical resistivity and that electrically connects the first electrode and the wiring part, and a second region that is aligned with the first region and has a second electrical resistivity higher than the first electrical resistivity of the first region.

According to the present invention, it is possible to provide a semiconductor device capable of improving a degree of freedom in designing a circuit.

DETAILED DESCRIPTION OF THE INVENTION

Hereinafter, embodiments of the present invention will be described with reference to the drawings. However, in each of second and subsequent embodiments, components identical to or similar to those of a first embodiment will be assigned by reference symbols identical to or similar to those of the first embodiment, and detailed descriptions thereof will be appropriately omitted. In each of the second and subsequent embodiments, the description of effects similar to those of the first embodiment will be appropriately omitted. The drawings of each embodiment are examples, and dimensions and shapes of each part are schematic. The technical scope of the present invention should not be limited to the embodiments.

In each drawing, in order to clarify a relationship between the drawings and to help understanding a positional relationship between members, a rectangular coordinate system (XYZ coordinate system) constituted by an X axis, a Y axis, and a Z axis may be used for the sake of convenience. In this case, for example, a direction parallel to the X axis is referred to as an "X-axis direction". The same applies to directions parallel to other axes. In the following description, a Z-axis positive direction side is referred to as "upper (upward)". The X-axis direction is not limited to a positive direction of an arrow, but also includes a negative direction opposite to the arrow. A plane parallel to a plane specified by the X axis and the Y axis is referred to as an "XY plane", and the same applies to a plane parallel to a plane specified by other axes.

First Embodiment

Figure 1:
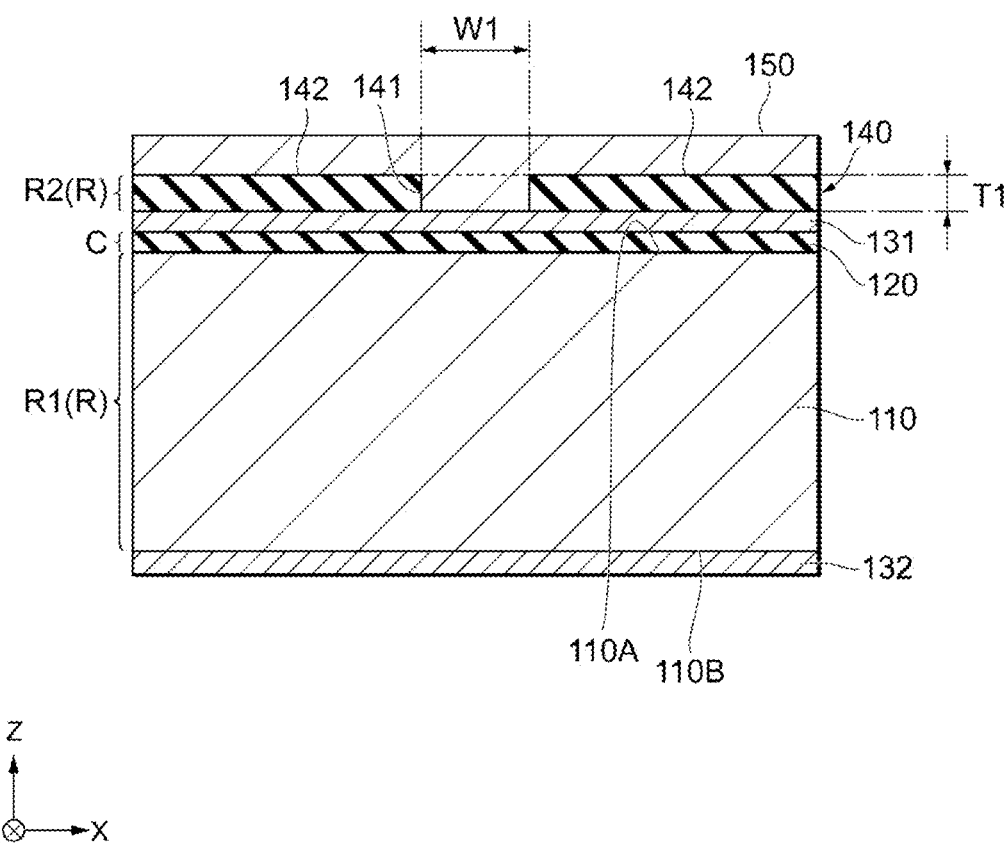
FIG. 1 is a cross-sectional view schematically illustrating a configuration of a semiconductor device according to a first embodiment.
Figure 2:
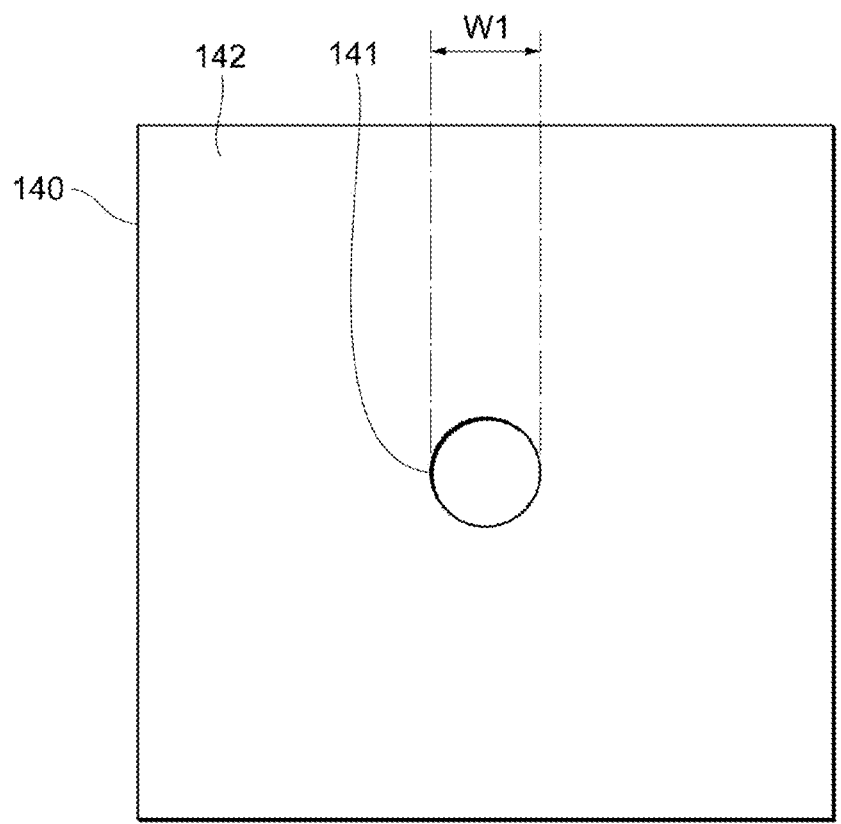
FIG. 2 is a plan view schematically illustrating the configuration of the semiconductor device according to the first embodiment.

First, a configuration of a semiconductor device 100 according to a first embodiment of the present invention will be described with reference to FIGS. 1 and 2. FIG. 1 is a cross-sectional view schematically illustrating the configuration of the semiconductor device according to the first embodiment. FIG. 2 is a plan view schematically illustrating the configuration of the semiconductor device according to the first embodiment. FIG. 2 illustrates the semiconductor device 100 when a resistance control layer 140 is viewed in plan view in a state in which a wiring part 150 is omitted.

The semiconductor device 100 is a semiconductor circuit in which a capacitor part C forming an electrostatic capacitance and a resistor part R functioning as an electrical resistor are integrally formed. That is, the semiconductor device 100 corresponds to a CR circuit. The semiconductor device 100 includes a semiconductor substrate 110, a dielectric layer 120, a first electrode 131, a second electrode 132, the resistance control layer 140, and the wiring part 150. The resistance control layer 140 corresponds to a first resistance control layer. The semiconductor substrate 110 functions as a resistor part R1, the dielectric layer 120 functions as the capacitor part C, and the resistance control layer 140 functions as a resistor part R2. The resistor part R includes the resistor part R1 and the resistor part R2. The semiconductor device 100 may be, for example, a discrete part independent of other elements, or may be a part of an IC package integrated with other elements.

The semiconductor substrate 110 has a first main surface 110A and a second main surface 110B parallel to the XY plane. The first main surface 110A is a main surface on the Z-axis positive direction side, and the second main surface 110B is a main surface on a Z-axis negative direction side. When viewed from a normal direction of the first main surface 110A, the semiconductor substrate 110 has a rectangular shape. However, a shape of the semiconductor substrate 110 is not limited to the aforementioned shape, and may be a polygon, a circle, an ellipse, or a combination thereof.

The semiconductor substrate 110 is formed as, for example, a p-type or n-type silicon substrate having an electrical resistivity of $10^{-4}$ $\Omega \cdot cm$ to $10^{-2}$ $\Omega \cdot cm$. In other words, the semiconductor substrate 110 is provided as a silicon substrate having an impurity concentration of $10^{19}$ $cm^{-3}$ to $10^{21}$ $cm^{-3}$.

Since the semiconductor substrate 110 is formed as the silicon substrate, the semiconductor substrate can be manufactured at a lower cost than when the semiconductor substrate is manufactured by using another semiconductor material. The semiconductor substrate 110 is formed as a silicon substrate having a low electrical resistivity of $10^{-2}$ $\Omega \cdot cm$ or less, and thus, the temperature dependence of mobility can be reduced. When the resistor part R is mainly constituted by the semiconductor substrate 110 as in the configuration of the related art, it is necessary to form the semiconductor substrate 110 as a silicon substrate having an electrical resistivity of 1 $\Omega \cdot cm$ or more. However, in the case of the silicon substrate having an electrical resistivity of 1 $\Omega \cdot cm$ or more, the mobility is greatly changed with a temperature change. As a specific example, in the case of an n-type silicon substrate having an impurity concentration of $10^{16}$ $cm^{-3}$, the mobility at 200° C. is about ⅕ of the mobility at −55° C. When the impurity concentration of the silicon substrate is $10^{19}$ $cm^{-3}$ or more, that is, the electrical resistivity is $10^{-2}$ $\Omega \cdot cm$ or less, it is possible to suppress an increase in electrical resistivity due to a decrease in mobility, and it is possible to suppress a temperature change in characteristics of the semiconductor device 100 as the semiconductor circuit. When the electrical resistivity is $10^{-4}$ $\Omega \cdot cm$ or more, the semiconductor substrate 110 can function as a semiconductor instead of a conductor. That is, the semiconductor substrate can function as the resistor part R1.

The semiconductor substrate 110 is not limited to the silicon substrate, and may be formed by a semiconductor material such as germanium (Ge), gallium arsenide (GaAs), or silicon carbide (SiC).

The dielectric layer 120 is formed between the first main surface 110A of the semiconductor substrate 110 and the first electrode 131. For example, the dielectric layer 120 is formed by a silicon compound such as a silicon oxide ($SiO_2$), a silicon nitride ($Si_3N_4$) film, or a silicon oxynitride (SiOxNy) film. When the semiconductor substrate 110 is the silicon substrate, the dielectric layer 120 formed by a silicon oxide can be easily provided by thermal oxidation of the silicon substrate, and generation of a leak current caused by a defect can be suppressed. Since the dielectric layer 120 formed by silicon nitride or silicon oxynitride can have a higher dielectric constant than that of the silicon oxide, the capacitance of the capacitor part C can be increased. The dielectric layer 120 may have a multilayer structure. For example, when the semiconductor substrate 110 is the silicon substrate, the dielectric layer 120 is formed by forming the silicon oxide on the first main surface 110A of the semiconductor substrate 110 by the thermal oxidation and depositing the silicon nitride on the silicon oxide by physical vapor deposition (PVD) or chemical vapor deposition (CVD). Accordingly, the dielectric layer 120 can increase the capacitance of the capacitor part C while suppressing the leak current. A chemical formula of the silicon compound is an example of a composition, and does not limit the composition of the silicon compound. Elements other than silicon (Si), oxygen (O), and nitrogen (N) may be included. Hereinafter, the same applies to other substances.

At least a part of the dielectric layer 120 may be formed by an oxide such as aluminum oxide ($Al_2O_3$), hafnium oxide ($HfO_2$), tantalum oxide ($Ta_2O_5$), barium titanate ($BaTiO_3$), barium strontium titanate ((BaSr)TiO$_3$), strontium titanate (SrTiO$_3$), or calcium zirconate (CaZrO$_3$). In order to increase the capacitance of the capacitor part C, the dielectric layer 120 desirably has a layer formed by using a material having a high dielectric constant, for example, desirably has a layer formed by a perovskite oxide having a dielectric constant higher than that of the silicon oxide.

The first electrode 131 is provided so as to oppose the first main surface 110A of the semiconductor substrate 110. The second electrode 132 is provided so as to oppose the second main surface 110B of the semiconductor substrate 110. The first electrode 131 covers the dielectric layer 120, and the second electrode 132 covers the second main surface 110B of the semiconductor substrate 110. The first electrode 131 may cover the entire surface of the dielectric layer 120, or may cover only the dielectric layer 120 in a region desired to function as the capacitor part C. The first electrode 131 and the second electrode 132 are formed by, for example, silicon with reduced resistance. The first electrode 131 and the second electrode 132 may be formed by metal such as Cu (copper), Ag (silver), Au (gold), Al (aluminum), Mo (molybdenum), W (tungsten), Pt (platinum), Ti (titanium), Ni (nickel), or Cr (chromium), or an alloy thereof. The first electrode 131 and the second electrode 132 may be an oxide such as RuO$_2$, SrRuO$_3$, LaNiO$_3$, or an organic material such as a conductive resin as long as these electrodes have conductivity. The first electrode 131 and the second electrode 132 may be electrodes having different configurations. The first electrode 131 and the second electrode 132 may have a multilayer structure. For example, when the semiconductor substrate 110 is the silicon substrate, the second electrode 132 may include a layer having good adhesion to the silicon substrate (for example, Cr) on a side that is in contact with the semiconductor substrate 110, and may include a layer (for example, Au) having high chemical stability on a side that is separated from the semiconductor substrate 110.

The resistance control layer 140 is formed on the first electrode 131, and is formed between the first electrode 131 and the wiring part 150. The resistance control layer 140 includes a low resistance region 141 and a high resistance region 142. The low resistance region 141 corresponds to a first region of the resistance control layer 140, and the high resistance region 142 corresponds to a second region of the resistance control layer 140. The low resistance region 141 is formed so as to electrically connect the first electrode 131 and the wiring part 150. The high resistance region 142 is aligned with the low resistance region 141 in a direction parallel to the first main surface 110A of the semiconductor substrate 110. An electrical resistivity of the high resistance region 142 is higher than an electrical resistivity of the low resistance region 141. For example, the low resistance region 141 is formed by a conductor, and the high resistance region 142 is formed by an insulator.

In the forming of the resistance control layer 140, for example, the low resistance region 141 is formed by forming an insulator layer on the first electrode 131 by the PVD or CVD, etching a part of the insulator layer, and providing a conductor in a space formed by the etching. The insulator layer left without being etched is used as the high resistance region 142. In such a semiconductor device 100, a thickness of the resistance control layer 140 can be increased, and a resistance value of the resistor part R2 can be easily changed. When the first electrode 131 is formed by silicon, a silicon oxide formed by thermal oxidation may be used as the insulator layer. Accordingly, a process of manufacturing the semiconductor device 100 can be simplified. That is, the manufacturing cost of the semiconductor device 100 can be reduced.

The low resistance region 141 and the high resistance region 142 may be formed by a semiconductor. In the forming of such a resistance control layer 140, for example, the high resistance region 142 is formed first, and the low resistance region 141 is provided next. Specifically, first, a high resistance semiconductor layer is formed on the first electrode 131 by the PVD or CVD. Subsequently, a resistance of a part of the high resistance semiconductor layer is reduced by doping. This low resistance part is referred to as the low resistance region 141, and the high resistance semiconductor layer is referred to as the high resistance region 142. In contrast, in the forming of the resistance control layer 140, the low resistance region 141 may be formed first, and the high resistance region 142 may be formed next. Specifically, first, a low resistance semiconductor layer is formed on the first electrode 131 by the PVD or CVD. Subsequently, a resistance of a part of the low resistance semiconductor layer is increased by reducing crystallinity thereof. This high resistance part may be used as the high resistance region 142, and the low resistance semiconductor layer may be used as the low resistance region 141. As described above, when the resistance control layer 140 is formed by decreasing or increasing the resistance of a part of the semiconductor layer, the resistance control layer 140 is formed such that the thicknesses of the low resistance region 141 and the high resistance region 142 are identical to each other. The occurrence of a defect such as separation between the low resistance region 141 and the high resistance region 142 can be suppressed.

Electricity mainly flows through the low resistance region 141 between the first electrode 131 and the wiring part 150. That is, the low resistance region 141 of the resistance control layer 140 functions as a conduction bottleneck between the first electrode 131 and the wiring part 150. Therefore, the resistance value of the resistor part R2 is changed depending on physical properties and dimensions of the low resistance region 141. Specifically, the resistance value of the resistor part R2 may be designed depending on the electrical resistivity of the low resistance region 141, a thickness T1 of the low resistance region 141 along a Z-axis direction, and a width W1 of the low resistance region 141 along the X-axis direction.

The width W1 is larger than the thickness T1. Accordingly, it is possible to suppress the defect of the resistance control layer 140 and the fluctuation of the resistance value of the resistor part R2. When the low resistance region 141 is formed by providing the conductor or the semiconductor in the space formed by the etching, the width W1 is larger than the thickness T1, and thus, the occurrence of the defect due to a failure in the forming of the low resistance region 141 can be suppressed. Since the width W1 is larger than the thickness T1, a cross-sectional shape of the low resistance region 141 is suppressed from being tapered or inversely tapered, and thus, the fluctuation of the resistance value of the resistor part R2 between the individual semiconductor devices 100 can be suppressed.

When the low resistance region 141 is formed by reducing the resistance of a part of the semiconductor layer, the width W1 is larger than the thickness T1, and thus, the impurity concentration of the low resistance region 141 along the Z-axis direction can be easily uniform. That is, it is possible to suppress the fluctuation of the resistance value of the resistor part R2 between the individual semiconductor devices 100. Since the width W1 is larger than the thickness T1, even though irradiation energy of impurities during the doping is reduced, the low resistance region 141 can be uniformly doped. Accordingly, it is possible to suppress the occurrence of the defect in the low resistance region 141.

The resistance value of the resistor part R2 can be designed by a cross-sectional area of the low resistance region 141 parallel to the first main surface 110A of the semiconductor substrate 110. Thus, dimensions for designing the resistance value of the resistor part R2 are not limited to the thickness T1 of the low resistance region 141 along the Z-axis direction and the width W1 along the X-axis direction. The resistance value of the resistor part R2 may be designed by the shape of the low resistance region 141 in plan view or the width along the Y-axis direction.

In the configuration example illustrated in FIG. 2, the low resistance region 141 of the resistance control layer 140 is formed in a circular shape when the first main surface 110A of the semiconductor substrate 110 is viewed in plan view. A diameter of the low resistance region 141 is the width W1. By forming the low resistance region 141 in the circular shape, defects such as insulation breakdown caused by electric field concentration that may occur at the corner or damage caused by stress concentration that may occur at the corner can be suppressed when the low resistance region 141 has a corner. When the first main surface 110A of the semiconductor substrate 110 is viewed in plan view, a shape of the low resistance region 141 is not limited to the aforementioned shape, and may be an ellipse, a rectangle, a polygon, or a combination thereof.

The low resistance region 141 of the resistance control layer 140 is formed integrally with the wiring part 150 by a material similar to a material of the wiring part 150 to be described below. At this time, the electrical resistivity of the low resistance region 141 is equal to an electrical resistivity of the wiring part 150. Accordingly, the low resistance region 141 and the wiring part 150 can be simultaneously formed by the same process. That is, the manufacturing process of the semiconductor device 100 can be simplified, and the manufacturing cost thereof can be reduced. Since types of interfaces at which different materials are in contact with each other between the resistance control layer 140 and the wiring part 150 can be reduced, the occurrence of a defect such as separation between the resistance control layer 140 and the wiring part 150 can be suppressed.

The wiring part 150 is formed on the resistance control layer 140. The wiring part 150 is a part for electrically connecting the semiconductor device 100 to an external circuit. The wiring part 150 can be formed by a material exemplified as the material forming the first electrode 131 and the second electrode 132. The electrical resistivity of the wiring part 150 is, for example, equal to or lower than an electrical resistivity of the first electrode 131. Accordingly, in the semiconductor device 100, the influence of the wiring part 150 on the resistance value of the resistor part R can be suppressed.

As described above, in the semiconductor device 100, since the resistance value of the resistor part R2 can be changed by the resistance control layer 140, it is possible to suitably change a combination of the element values of the capacitor part C and the resistor part R. That is, a degree of freedom in designing the semiconductor device 100 as the semiconductor circuit can be improved.

When the semiconductor device 100 is formed as a part of a circuit integrated on the semiconductor substrate 110, the wiring part 150 may be connected to another circuit or element by extending to the first main surface 110A of the semiconductor substrate 110. When the semiconductor device 100 is singulated and electrically connected to an external circuit by bonding, the wiring part 150 may be formed in a flat plate shape, and may function as a bonding pad.

Figure 3:
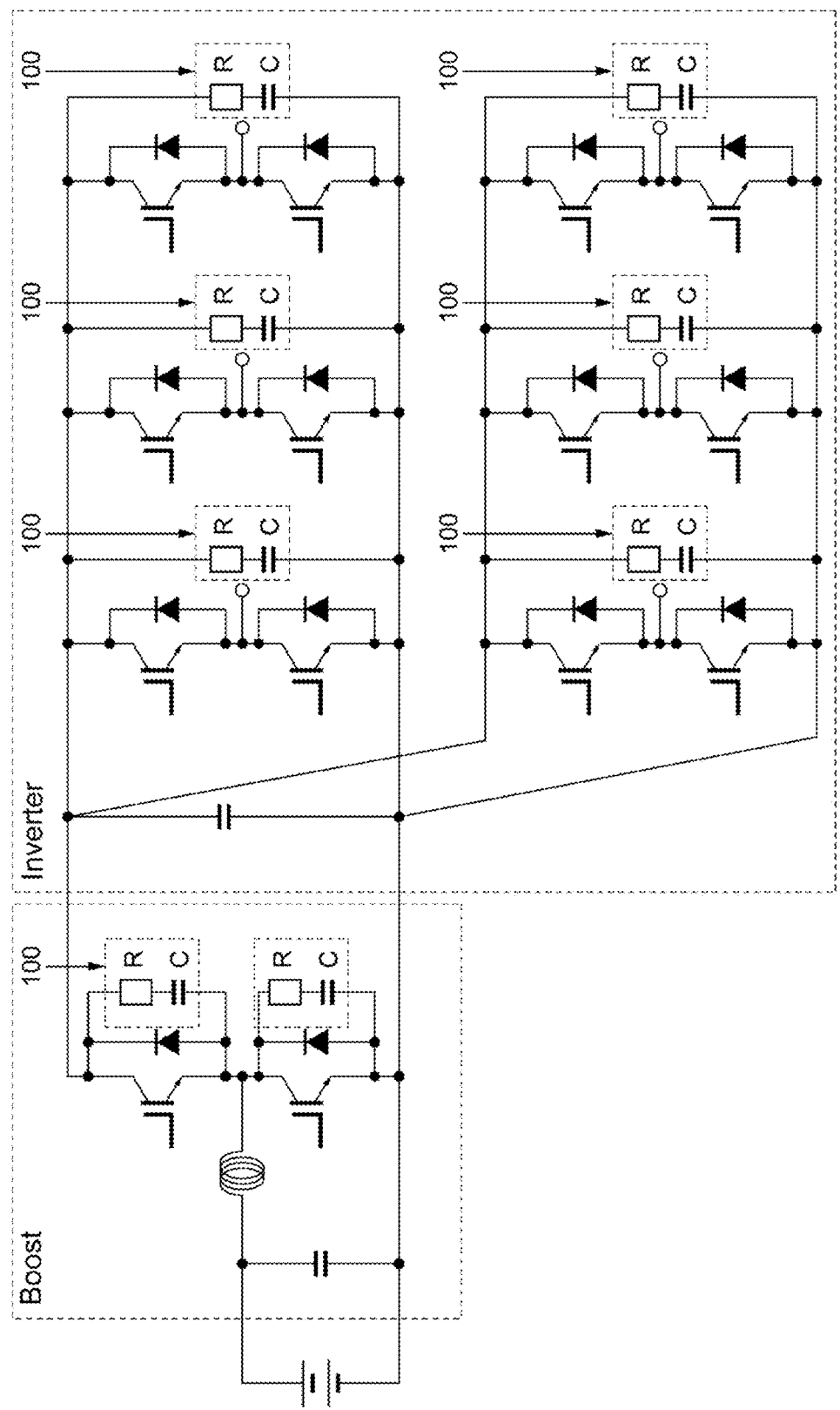
FIG. 3 is a circuit diagram schematically illustrating an implementation example of the semiconductor device according to the first embodiment as a circuit.

Next, an application example of the semiconductor device 100 will be described with reference to FIG. 3. FIG. 3 is a circuit diagram schematically illustrating an implementation example of the semiconductor device according to the first embodiment as the circuit.

The semiconductor device 100 is used for, for example, a boost circuit or an inverter circuit. The semiconductor device 100 can function as a snubber circuit by being connected in parallel between a drain and a source or between a collector and an emitter of a transistor. In the semiconductor device 100, even though the dimensions of the semiconductor device 100 are changed, the resistance value of the resistor part R can be changed in accordance with the electrostatic capacitance of the capacitor part C. That is, even though the dimension of the semiconductor device 100 is limited, the semiconductor device 100 can be designed as the semiconductor circuit having a suitable electrostatic capacitance and resistance value as the snubber circuit. The semiconductor device 100 can have a sufficient resistance value as the snubber circuit. Therefore, the semiconductor device 100 can be used as the snubber circuit without electrically connecting a resistance element to the outside.

The application of the semiconductor device 100 is not limited to the snubber circuit. For example, the semiconductor device 100 may be used as a part of a filter circuit or a matching circuit.

Second Embodiment

Figure 4:
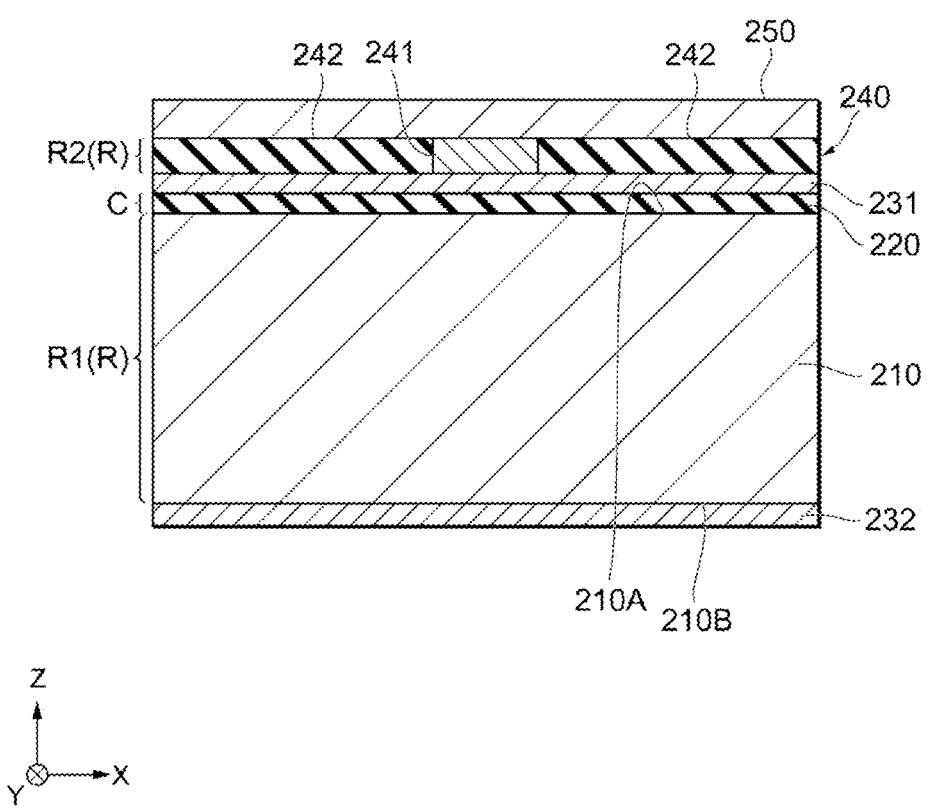
FIG. 4 is a cross-sectional view schematically illustrating a configuration of a semiconductor device according to a second embodiment.

Next, a configuration of a semiconductor device 200 according to a second embodiment will be described with reference to FIG. 4. FIG. 4 is a cross-sectional view schematically illustrating the configuration of the semiconductor device according to the second embodiment.

The semiconductor device 200 according to the second embodiment includes a semiconductor substrate 210, a dielectric layer 220, a first electrode 231, a second electrode 232, a resistance control layer 240, and a wiring part 250 as in the semiconductor device 100 according to the first embodiment. The resistance control layer 240 includes a low resistance region 241 and a high resistance region 242.

The semiconductor device 200 according to the second embodiment is different from the semiconductor device 100 according to the first embodiment in that the low resistance region 241 of the resistance control layer 240 is formed by a material different from that of the wiring part 250.

An electrical resistivity of the low resistance region 241 is higher than an electrical resistivity of the wiring part 250. Accordingly, the resistance value of the resistor part R2 can be increased. That is, a degree of freedom in designing the semiconductor device 200 as a semiconductor circuit can be improved. The electrical resistivity of the low resistance region 241 is higher than an electrical resistivity of the first electrode 231. Accordingly, the resistance value of the resistor part R2 can be increased. That is, a degree of freedom in designing the semiconductor device 200 as a semiconductor circuit can be improved.

Third Embodiment

Figure 5:
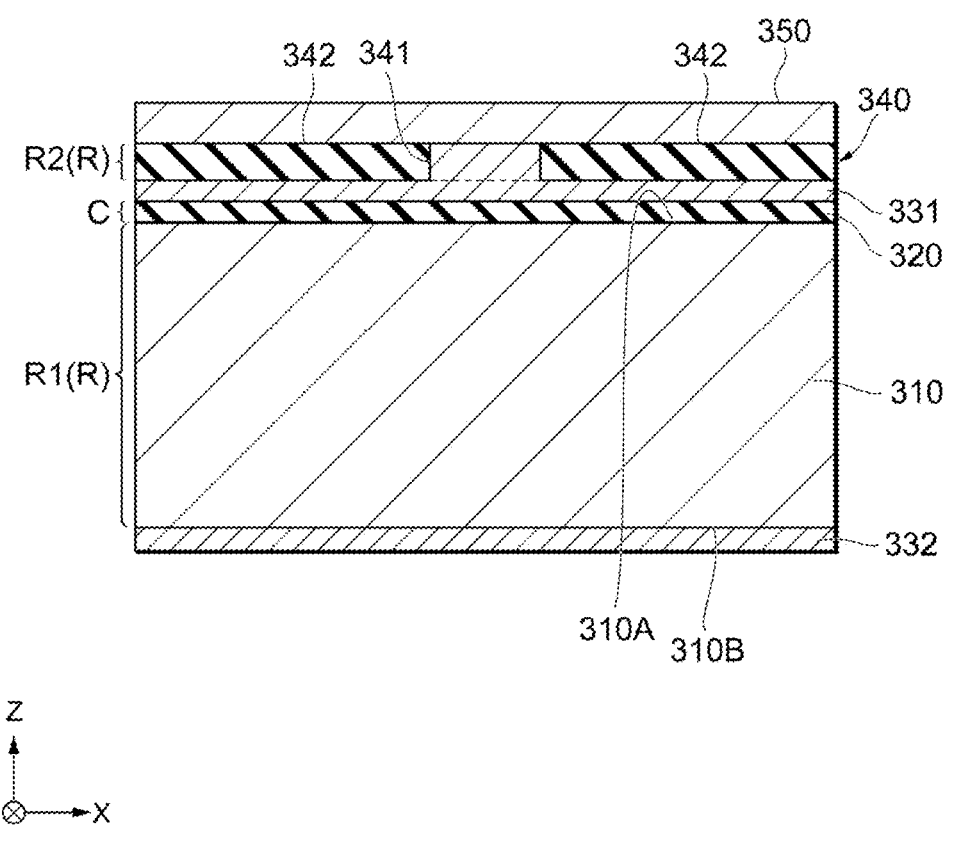
FIG. 5 is a cross-sectional view schematically illustrating a configuration of a semiconductor device according to a third embodiment.

Next, a configuration of a semiconductor device 300 according to a third embodiment will be described with reference to FIG. 5. FIG. 5 is a cross-sectional view schematically illustrating the configuration of the semiconductor device according to the third embodiment.

The semiconductor device 300 according to the third embodiment includes a semiconductor substrate 310, a dielectric layer 320, a first electrode 331, a second electrode 332, a resistance control layer 340, and a wiring part 350 as in the semiconductor device 100 according to the first embodiment. The resistance control layer 340 includes a low resistance region 341 and a high resistance region 342.

The semiconductor device 300 according to the third embodiment is different from the semiconductor device 100 according to the first embodiment in that the low resistance region 341 of the resistance control layer 340 is formed integrally with the first electrode 331 by a material similar to a material of the first electrode 331. That is, an electrical resistivity of the low resistance region 341 is equal to an electrical resistivity of the first electrode 331.

Accordingly, the low resistance region 341 and the first electrode 331 can be simultaneously formed by the same process. Since types of interfaces at which different materials are in contact with each other between the resistance control layer 340 and the first electrode 331 can be reduced, the occurrence of a defect such as separation between the resistance control layer 340 and the first electrode 331 can be suppressed.

In the forming of the resistance control layer 340, for example, the high resistance region 342 is formed by etching a part of the conductor layer formed on the dielectric layer 320 and providing an insulator in a space formed by the etching. Accordingly, a thickness of the low resistance region 341 can be increased, and the resistance value of the resistor part R2 can be easily changed. In the forming of the resistance control layer 340, the high resistance region 342 may be formed by increasing a resistance of a part of the semiconductor layer formed on the dielectric layer 320. When the first electrode 331 is formed by silicon, the high resistance region 342 may be formed by thermally oxidizing a part of the silicon layer formed on the dielectric layer 320 in the forming of the resistance control layer 340. Accordingly, a process of manufacturing the semiconductor device 300 can be simplified. That is, the manufacturing cost of the semiconductor device 300 can be reduced.

Fourth Embodiment

Figure 6:
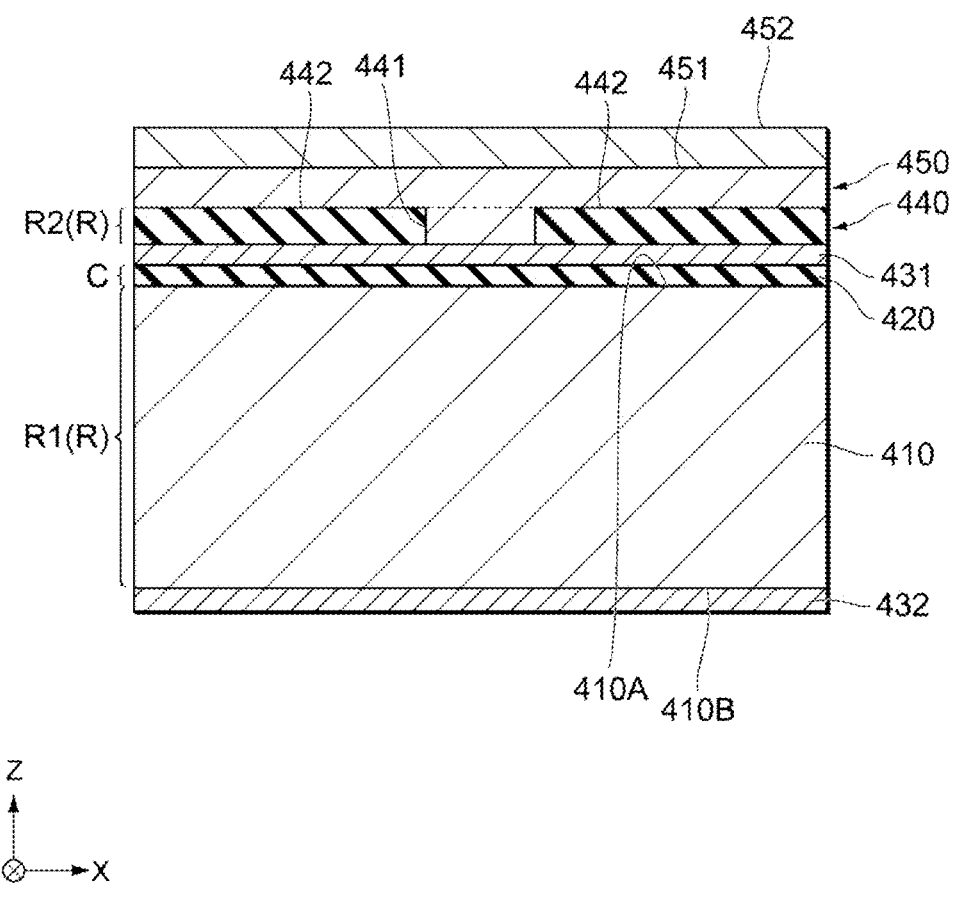
FIG. 6 is a cross-sectional view schematically illustrating a configuration of a semiconductor device according to a fourth embodiment.

Next, a configuration of a semiconductor device 400 according to a fourth embodiment will be described with reference to FIG. 6. FIG. 6 is a cross-sectional view schematically illustrating the configuration of the semiconductor device according to the fourth embodiment.

The semiconductor device 400 according to the fourth embodiment includes a semiconductor substrate 410, a dielectric layer 420, a first electrode 431, a second electrode 432, a resistance control layer 440, and a wiring part 450 as in the semiconductor device 100 according to the first embodiment. The resistance control layer 440 includes a low resistance region 441 and a high resistance region 442.

The semiconductor device 400 according to the fourth embodiment is different from the semiconductor device 100 according to the first embodiment in that the wiring part 450 includes a first wiring layer 451 and a second wiring layer 452. The first wiring layer 451 is formed on the high resistance region 442 of the resistance control layer 440, and is formed inside the low resistance region 441 of the resistance control layer 440. That is, the low resistance region 441 and the first wiring layer 451 are integrally formed by the same material. The second wiring layer 452 is formed on the first wiring layer 451.

An electrical resistivity of the second wiring layer 452 is lower than an electrical resistivity of the first wiring layer 451. Accordingly, even though the low resistance region 441 is formed by a high resistance material in order to increase the resistance value of the resistor part R2, an increase in the resistance value of the wiring part 450 can be suppressed. The second wiring layer 452 may be formed by a material having a higher hardness than that of the first wiring layer 451. Accordingly, when the wiring part 450 is electrically connected to an external circuit by soldering or wire bonding, damage of the wiring part 450 can be suppressed. The second wiring layer 452 may be formed by a material having higher adhesiveness to solder and bonding wires than the first wiring layer 451. Accordingly, when the wiring part 450 is electrically connected to an external circuit by soldering or wire bonding, a contact failure of the semiconductor device 400 can be suppressed.

Fifth Embodiment

Figure 7:
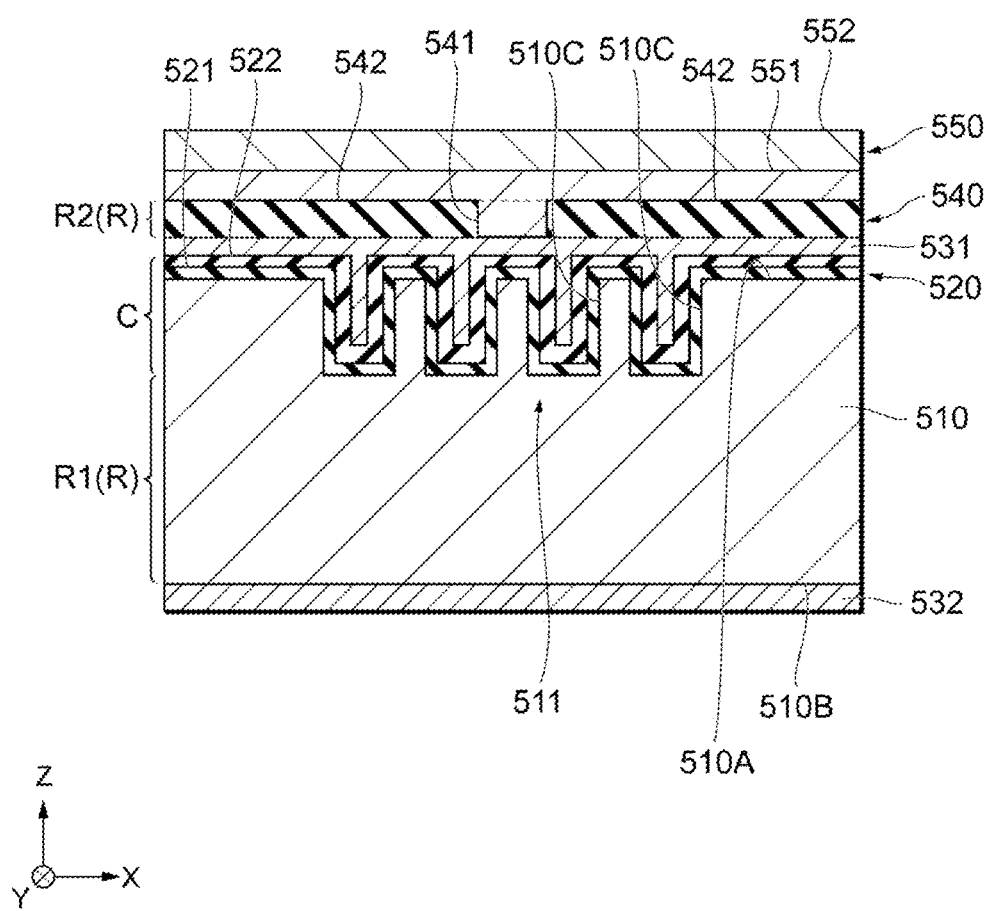
FIG. 7 is a cross-sectional view schematically illustrating a configuration of a semiconductor device according to a fifth embodiment.
Figure 8:
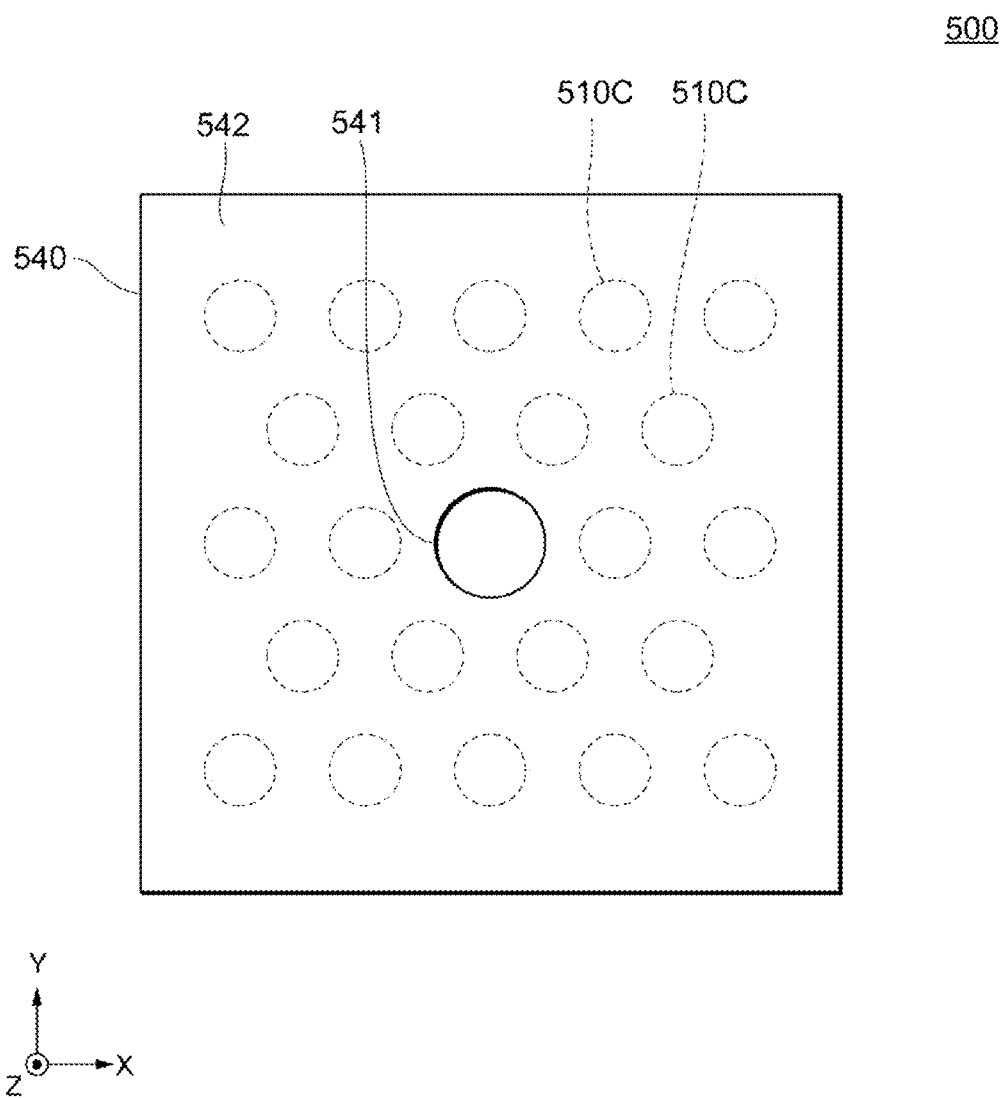
FIG. 8 is a plan view schematically illustrating a configuration of a semiconductor device according to a fifth embodiment.

Next, a configuration of a semiconductor device 500 according to a fifth embodiment will be described with reference to FIGS. 7 and 8. FIG. 7 is a cross-sectional view schematically illustrating the configuration of the semiconductor device according to the fifth embodiment. FIG. 8 is a plan view schematically illustrating the configuration of the semiconductor device according to the fifth embodiment. FIG. 8 illustrates the semiconductor device 500 when a resistance control layer 540 is viewed in plan view in a state in which a wiring part 550 is omitted.

The semiconductor device 500 according to the fifth embodiment includes a semiconductor substrate 510, a dielectric layer 520, a first electrode 531, a second electrode 532, the resistance control layer 540, and the wiring part 550 as in the semiconductor device 400 according to the fourth embodiment. The resistance control layer 540 includes a low resistance region 541 and a high resistance region 542.

The semiconductor device 500 according to the fifth embodiment is different from the semiconductor device 400 according to the fourth embodiment in that a trench structure 511 including a plurality of trench portions 510C is formed so as to extend into the semiconductor substrate 510 from a first main surface 510A of the semiconductor substrate 510.

The trench portion 510C is a recess portion formed so as to extend from the first main surface 510A in the Z-axis direction. The trench portion 510C is formed in a circular shape when the first main surface 510A is viewed in plan view. The dielectric layer 520 and the first electrode 531 are formed along the trench structure 511, and extend inside the trench portion 510C. The semiconductor device 500 has the trench structure, and thus, the electrostatic capacitance of the capacitor part C can be increased. A shape of the trench portion 510C in plan view is not limited to the circular shape, but may be an ellipse, a rectangle, a polygon, a lattice, or a combination thereof. A shape of the trench portion 510C is not limited to a columnar shape, and may be a cone shape or a combination thereof. The number of the trench portion 510C is not particularly limited, and at least one trench portion may be formed.

When the first main surface 510A of the semiconductor substrate 510 is viewed in plan view, the low resistance region 541 of the resistance control layer 540 is formed outside the trench portion 510C. Accordingly, it is possible to suppress internal stress caused by the resistance control layer 540 and the wiring part 550 from being concentrated at a corner of the trench portion 510C. Accordingly, in the semiconductor device 500, damage of the dielectric layer 520 can be suppressed.

The dielectric layer 520 includes a first dielectric layer 521 and a second dielectric layer 522. In the semiconductor device 500, stress is concentrated on the corner of the trench portion 510C, and the dielectric layer 520 may be easily damaged. Since the dielectric layer 520 includes two different types of dielectric layers, the internal stress can be relaxed, and the occurrence of the damage can be suppressed. The first dielectric layer 521 has a configuration in which it is difficult to cause damage, and the second dielectric layer 522 is set to have a dielectric constant higher than a dielectric constant of the first dielectric layer 521. Accordingly, the occurrence of a leakage current can be suppressed and also the increase in the electrostatic capacitance in the capacitor part C of the semiconductor device 500 can be achieved.

Sixth Embodiment

Figure 9:
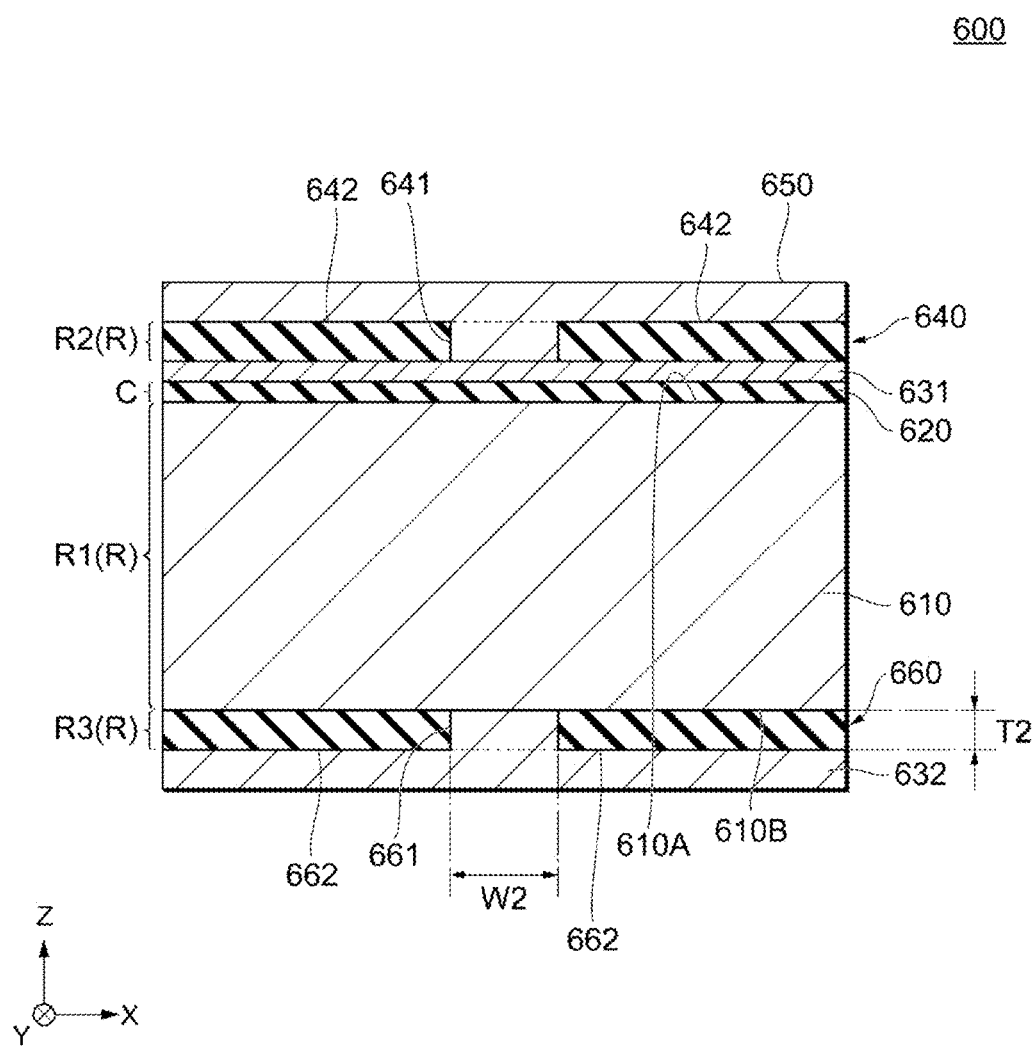
FIG. 9 is a cross-sectional view schematically illustrating a configuration of a semiconductor device according to a sixth embodiment.

Next, a configuration of a semiconductor device 600 according to a sixth embodiment will be described with reference to FIG. 9. FIG. 9 is a cross-sectional view schematically illustrating the configuration of the semiconductor device according to the sixth embodiment.

The semiconductor device 600 according to the sixth embodiment includes a semiconductor substrate 610, a dielectric layer 620, a first electrode 631, a second electrode 632, a resistance control layer 640, and a wiring part 650 as in the semiconductor device 100 according to the first embodiment. The resistance control layer 640 includes a low resistance region 641 and a high resistance region 642.

The semiconductor device 600 according to the sixth embodiment is different from the semiconductor device 100 according to the first embodiment in that a resistance control layer 660 is provided. The resistance control layer 660 functions as a resistor part R3. That is, the resistor part R of the semiconductor device 600 includes the resistor part R1, the resistor part R2, and the resistor part R3.

The resistance control layer 660 corresponds to a second resistance control layer. The resistance control layer 660 is formed between a second main surface 610B of the semiconductor substrate 610 and the second electrode 632. The resistance control layer 660 includes a low resistance region 661 and a high resistance region 662. The low resistance region 661 corresponds to a third region of the resistance control layer 660, and the high resistance region 662 corresponds to a fourth region of the resistance control layer 660. The low resistance region 661 is formed so as to electrically connect the semiconductor substrate 610 and the second electrode 632. The high resistance region 662 is aligned with the low resistance region 661 in a direction parallel to the second main surface 610B of the semiconductor substrate 610. An electrical resistivity of the high resistance region 662 is higher than an electrical resistivity of the low resistance region 661. For example, the low resistance region 661 is formed by a conductor, and the high resistance region 662 is provided by an insulator.

In the forming of the resistance control layer 660, for example, the low resistance region 661 is formed by forming an insulator layer on the second main surface 610B of the semiconductor substrate 610 by the PVD or CVD, etching a part of the insulator layer, and providing a conductor in a space formed by the etching. The insulator layer left without being etched is referred to as the high resistance region 662. In such a semiconductor device 600, a thickness of the resistance control layer 660 can be increased, and a resistance value of the resistor part R3 can be easily changed. When the semiconductor substrate 610 is formed by silicon, a silicon oxide formed by thermal oxidation may be used as the insulator layer. Accordingly, a process of manufacturing the semiconductor device 600 can be simplified. That is, the manufacturing cost of the semiconductor device 600 can be reduced.

The low resistance region 661 and the high resistance region 662 may be provided by a semiconductor. In the forming of such a resistance control layer 660, for example, the high resistance region 662 is formed first, and the low resistance region 661 is formed next. Specifically, first, a high resistance semiconductor layer is formed on the second main surface 610B of the semiconductor substrate 610 by the PVD or CVD. Subsequently, a resistance of a part of the high resistance semiconductor layer is reduced by doping. This low resistance part is referred to as the low resistance region 661, and the high resistance semiconductor layer is referred to as the high resistance region 662. In contrast, in the forming of the resistance control layer 660, the low resistance region 661 may be formed first, and the high resistance region 662 may be formed next. Specifically, first, a low resistance semiconductor layer is formed on the second main surface 610B of the semiconductor substrate 610 by the PVD or CVD. Subsequently, a resistance of a part of the low resistance semiconductor layer is increased by reducing crystallinity thereof. This high resistance part may be referred to as the high resistance region 662, and the low resistance semiconductor layer may be referred to as the low resistance region 661. As described above, when the resistance control layer 660 is provided by decreasing or increasing the resistance of a part of the semiconductor layer, the resistance control layer 660 can be formed such that thicknesses of the low resistance region 661 and the high resistance region 662 are identical to each other. The occurrence of a defect such as separation between the low resistance region 661 and the high resistance region 662 can be suppressed.

Electricity mainly flows through the low resistance region 661 between the second electrode 632 and the semiconductor substrate 610. That is, the low resistance region 661 of the resistance control layer 660 functions as a conduction bottleneck between the second electrode 632 and the semiconductor substrate 610. Therefore, the resistance value of the resistor part R3 is changed depending on physical properties and dimensions of the low resistance region 661. Specifically, the resistance value of the resistor part R3 can be designed depending on the electrical resistivity of the low resistance region 661, a thickness T2 of the low resistance region 661 along the Z-axis direction, and a width W2 of the low resistance region 661 along the X-axis direction.

The width W2 is larger than the thickness T2. Accordingly, it is possible to suppress the defect of the resistance control layer 660 and the fluctuation of the resistance value of the resistor part R3. When the low resistance region 661 is formed by providing a conductor or a semiconductor in the space formed by the etching, the width W2 is larger than the thickness T2, and thus, the occurrence of the defect due to a failure in the forming of the low resistance region 661 can be suppressed. Since the width W2 is larger than the thickness T2, a cross-sectional shape of the low resistance region 661 is suppressed from being tapered or inversely tapered, and thus, the fluctuation of the resistance value of the resistor part R3 between the individual semiconductor devices 600 can be suppressed.

When the low resistance region 661 is formed by decreasing the resistance of a part of the semiconductor layer, the width W2 is larger than the thickness T2, and thus, the impurity concentration of the low resistance region 661 along the Z-axis direction is easily uniformed. That is, it is possible to suppress the fluctuation of the resistance value of the resistor part R3 between the individual semiconductor devices 600. Since the width W2 is larger than the thickness T2, even though the irradiation energy of impurities during the doping is reduced, the low resistance region 661 can be uniformly doped. Accordingly, the occurrence of the defect in the low resistance region 661 can be suppressed.

Although not illustrated, the low resistance region 661 is formed in a circular shape when the second main surface 610B of the semiconductor substrate 610 is viewed in plan view. Accordingly, similarly to the resistance control layer 640, the resistance control layer 660 can suppress the defect such as insulation breakdown due to electric field concentration and damage due to stress concentration. When the second main surface 610B of the semiconductor substrate 610 is viewed in plan view, a shape of the low resistance region 661 may be an ellipse, a rectangle, a polygon, or a combination thereof.

The low resistance region 661 of the resistance control layer 660 is formed integrally with the second electrode 632 by a material similar to a material of the second electrode 632. At this time, the electrical resistivity of the low resistance region 661 is equal to an electrical resistivity of the second electrode 632. Accordingly, the low resistance region 661 and the second electrode 632 can be simultaneously formed by the same process. That is, the manufacturing process of the semiconductor device 600 can be simplified, and the manufacturing cost can be reduced. Since types of interfaces at which different materials are in contact with each other between the resistance control layer 660 and the second electrode 632 can be reduced, the occurrence of a defect such as separation between the resistance control layer 660 and the second electrode 632 can be suppressed. The electrical resistivity of the semiconductor substrate 610 is equal to or higher than that of the second electrode 632. Accordingly, in the semiconductor device 100, the influence of the second electrode 632 on the resistance value of the resistor part R can be suppressed.

Seventh Embodiment

Figure 10:
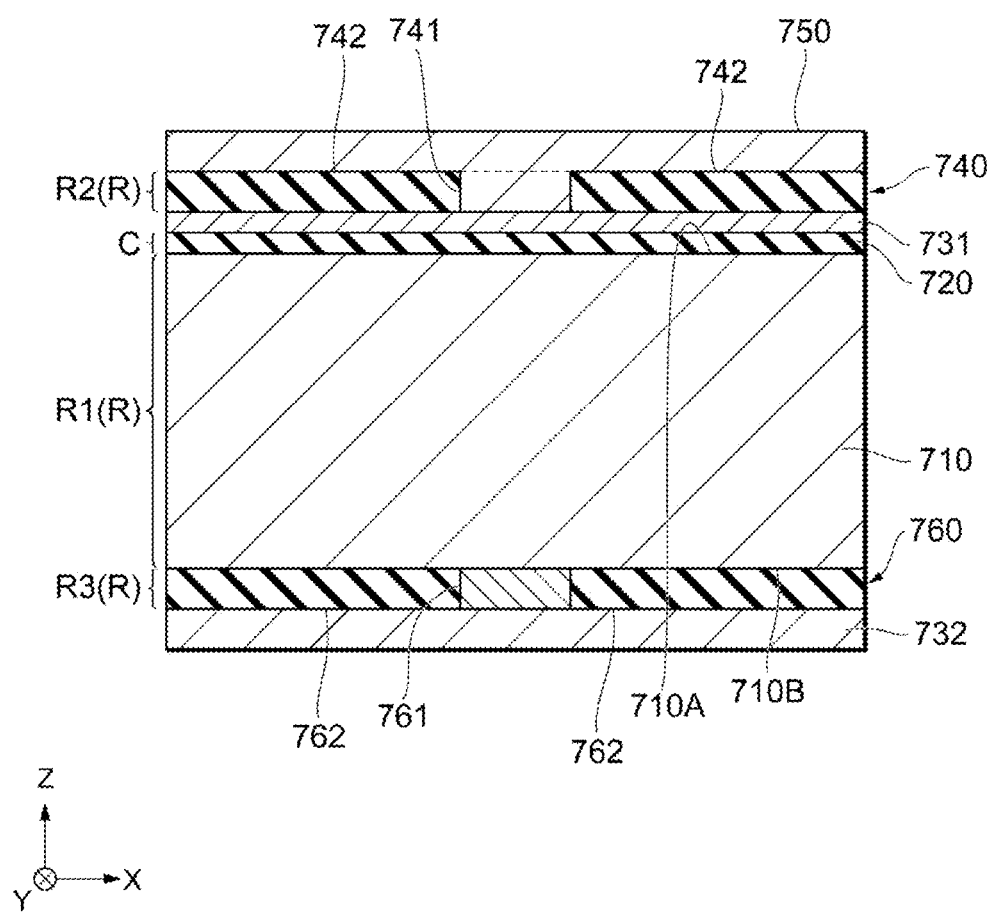
FIG. 10 is a cross-sectional view schematically illustrating a configuration of a semiconductor device according to a seventh embodiment.

Next, a configuration of a semiconductor device 700 according to a seventh embodiment will be described with reference to FIG. 10. FIG. 10 is a cross-sectional view schematically illustrating the configuration of the semiconductor device according to the seventh embodiment.

The semiconductor device 700 according to the seventh embodiment includes a semiconductor substrate 710, a dielectric layer 720, a first electrode 731, a second electrode 732, a resistance control layer 740, a wiring part 750, and a resistance control layer 760 as in the semiconductor device 600 according to the sixth embodiment. The resistance control layer 740 includes a low resistance region 741 and a high resistance region 742. The resistance control layer 760 includes a low resistance region 761 and a high resistance region 762.

The semiconductor device 700 according to the seventh embodiment is different from the semiconductor device 600 according to the sixth embodiment in that the low resistance region 761 of the resistance control layer 760 is formed by a material different from that of the second electrode 732.

An electrical resistivity of the low resistance region 761 is higher than an electrical resistivity of the second electrode 732. Accordingly, the resistance value of the resistor part R3 can be increased. That is, the degree of freedom in designing the semiconductor device 700 as a semiconductor circuit can be improved. The electrical resistivity of the low resistance region 761 is higher than an electrical resistivity of the semiconductor substrate 710. Accordingly, the resistance value of the resistor part R3 can be increased. That is, the degree of freedom in designing the semiconductor device 700 as a semiconductor circuit can be improved.

Eighth Embodiment

Figure 11:
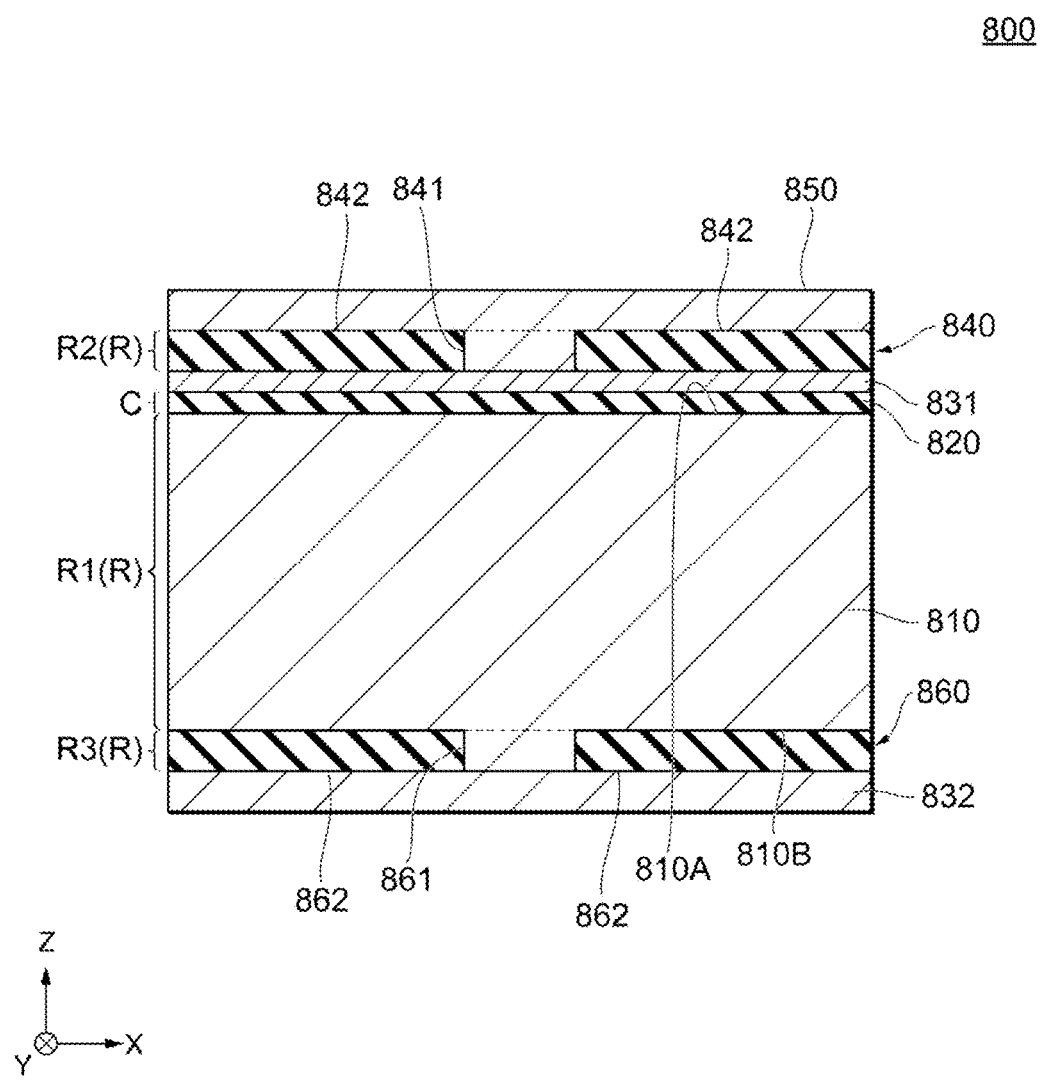
FIG. 11 is a cross-sectional view schematically illustrating a configuration of a semiconductor device according to an eighth embodiment.

Next, a configuration of a semiconductor device 800 according to an eighth embodiment will be described with reference to FIG. 11. FIG. 11 is a cross-sectional view schematically illustrating the configuration of the semiconductor device according to the eighth embodiment.

The semiconductor device 800 according to the eighth embodiment includes a semiconductor substrate 810, a dielectric layer 820, a first electrode 831, a second electrode 832, a resistance control layer 840, a wiring part 850, and a resistance control layer 860 as in the semiconductor device 600 according to the sixth embodiment. The resistance control layer 840 includes a low resistance region 841 and a high resistance region 842. The resistance control layer 860 includes a low resistance region 861 and a high resistance region 862.

The semiconductor device 800 according to the eighth embodiment is different from the semiconductor device 600 according to the sixth embodiment in that the low resistance region 861 of the resistance control layer 860 is formed integrally with the semiconductor substrate 810 by a material identical to a material of the semiconductor substrate 810. That is, an electrical resistivity of the low resistance region 861 is equal to an electrical resistivity of the semiconductor substrate 810.

Accordingly, the semiconductor substrate 810 and the low resistance region 861 can be simultaneously formed by the same process. Since types of interfaces at which different materials are in contact with each other between the semiconductor substrate 810 and the resistance control layer 860 can be reduced, the occurrence of a defect such as separation between the semiconductor substrate 810 and the resistance control layer 860 can be suppressed.

In the forming of the resistance control layer 860, for example, the high resistance region 862 is formed by etching a part of the semiconductor substrate 810 and providing an insulator in a space formed by the etching. Accordingly, a thickness of the low resistance region 861 can be increased, and the resistance value of the resistor part R3 can be easily changed. In the forming of the resistance control layer 860, the high resistance region 862 may be formed by increasing a resistance of a part of the semiconductor substrate 810. For example, when the semiconductor substrate 810 is formed by silicon, the high resistance region 862 may be formed by thermally oxidizing a part of the semiconductor substrate 810 in the forming of the resistance control layer 860. Accordingly, a process of manufacturing the semiconductor device 800 can be simplified. That is, the manufacturing cost of the semiconductor device 800 can be reduced.

Ninth Embodiment

Figure 12:
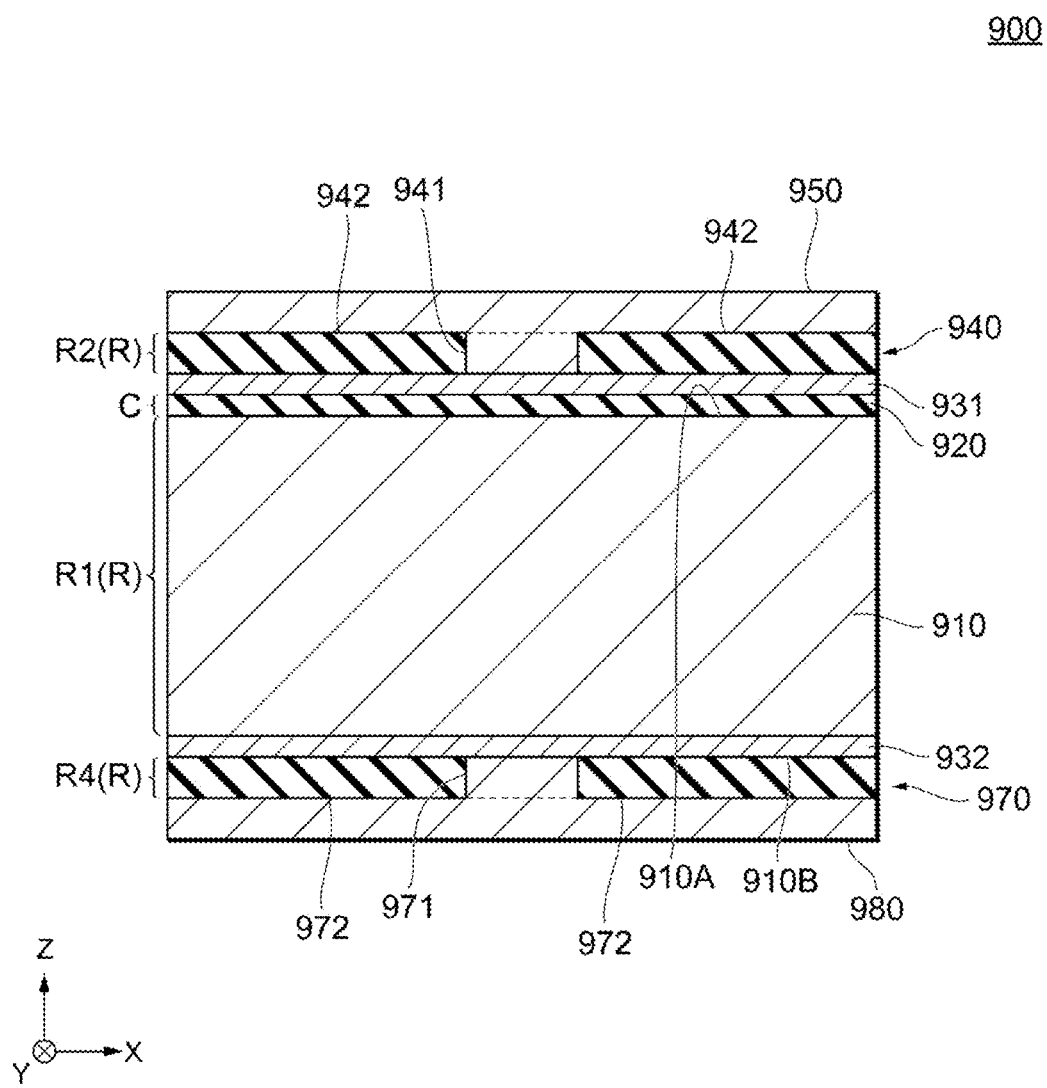
FIG. 12 is a cross-sectional view schematically illustrating a configuration of a semiconductor device according to a ninth embodiment.

Next, a configuration of a semiconductor device 900 according to a ninth embodiment will be described with reference to FIG. 12. FIG. 12 is a cross-sectional view schematically illustrating the configuration of the semiconductor device according to the ninth embodiment.

The semiconductor device 800 according to the ninth embodiment includes a semiconductor substrate 910, a dielectric layer 920, a first electrode 931, a second electrode 932, a resistance control layer 940, and a wiring part 950 as in the semiconductor device 100 according to the first embodiment. The resistance control layer 940 includes a low resistance region 941 and a high resistance region 942.

The semiconductor device 900 according to the ninth embodiment is different from the semiconductor device 100 according to the first embodiment in that a resistance control layer 970 and a wiring part 980 are provided. The resistance control layer 970 is formed between the second electrode 932 and the wiring part 980. The wiring part 980 is formed so as to oppose the second main surface 910B of the semiconductor substrate 910, and is used for electrically connecting the second electrode 932 to an external circuit. The resistance control layer 970 functions as a resistor part R4. That is, the resistor part R includes the resistor part R1, the resistor part R2, and the resistor part R4.

The resistance control layer 970 includes a low resistance region 971 and a high resistance region 972. The low resistance region 971 is formed so as to electrically connect the second electrode 932 and the wiring part 980. The high resistance region 972 is aligned with the low resistance region 971 in a direction parallel to the second main surface 910B of the semiconductor substrate 910. An electrical resistivity of the high resistance region 972 is higher than an electrical resistivity of the low resistance region 971.

Configurations of the second electrode 932, the resistance control layer 970, and the wiring part 980 and a relationship therebetween are similar to configurations of the first electrode 931, the resistance control layer 940, and the wiring part 950 and a relationship therebetween. Therefore, a detailed description of the configurations and effects of the resistance control layer 970 and the wiring part 980 will be omitted.

Tenth Embodiment

Figure 13:
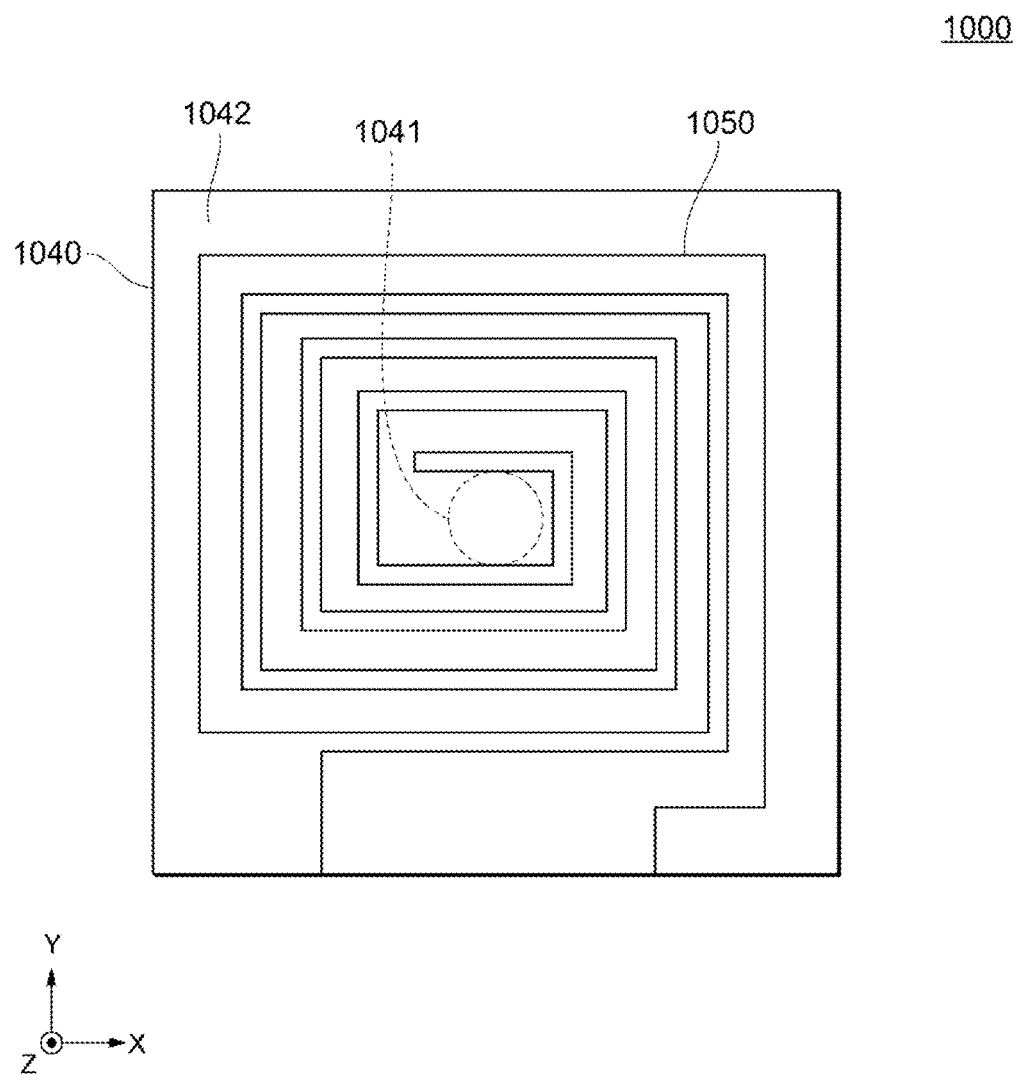
FIG. 13 is a cross-sectional view schematically illustrating a configuration of a semiconductor device according to a tenth embodiment.

Next, a configuration of a semiconductor device 1000 according to a tenth embodiment will be described with reference to FIG. 13. FIG. 13 is a plan view schematically illustrating the configuration of the semiconductor device according to the tenth embodiment.

Although partially omitted in FIG. 13, the semiconductor device 1000 according to the tenth embodiment has a semiconductor substrate, a dielectric layer, a first electrode, a second electrode, a resistance control layer 1040, and a wiring part 1050 as in the semiconductor device 100 according to the first embodiment. The resistance control layer 1040 includes a low resistance region 1041 and a high resistance region 1042.

The semiconductor device 1000 according to the tenth embodiment is different from the semiconductor device 100 according to the first embodiment in that the wiring part 1050 is patterned so as to form an inductor. For example, the wiring part 1050 is formed inside the low resistance region 1041, and is patterned in a spiral shape on the high resistance region 1042. Accordingly, the semiconductor device 1000 can be designed as an RLC circuit. The wiring part 1050 is not particularly limited as long as the wiring part has a shape of a desired inductance, and may be formed in, for example, a zigzag shape.

As described above, according to an aspect of the present invention, there is provided the semiconductor device 100 that includes the semiconductor substrate 110 having the first main surface 110A and the second main surface 110B, the first electrode 131 opposing the first main surface 110A of the semiconductor substrate 110, the dielectric layer 120 formed between the semiconductor substrate 110 and the first electrode 131, the first resistance control layer 140 formed on the first electrode 131, the wiring part 150 formed on the first resistance control layer 140, and the second electrode 132 opposing the second main surface 110B of the semiconductor substrate 110. The first resistance control layer 140 includes the first region 141 that electrically connects the first electrode 131 and the wiring part 150, and the second region 142 that is aligned with the first region 141 and has an electrical resistivity higher than an electrical resistivity of the first region 141.

According to the aforementioned aspect, the semiconductor device can be the semiconductor circuit in which the semiconductor substrate functions as the first resistor part, the dielectric layer functions as the capacitor part, and the first resistance control layer functions as the second resistor part. In the semiconductor device, the resistance value of the second resistor part can be changed depending on the electrical resistivity and the dimension of the first region of the first resistance control layer. That is, in the semiconductor device, the combination of the element values of the capacitor part and the resistor part can be suitably changed. In other words, a degree of freedom in designing the semiconductor device as the semiconductor circuit can be improved.

The electrical resistivity of the first region 241 of the first resistance control layer 240 may be equal to or higher than the electrical resistivity of the wiring part 250. Accordingly, when the first region and the wiring part have the same electrical resistivity, the first region and the wiring part can be simultaneously formed by the same process. That is, the manufacturing process of the semiconductor device can be simplified, and the manufacturing cost can be reduced. Since types of interfaces at which different materials are in contact with each other between the first resistance control layer and the wiring part can be reduced, the occurrence of a defect such as separation between the first resistance control layer and the wiring part can be suppressed. When the electrical resistivity of the first region is higher than the electrical resistivity of the wiring part, the resistance value of the second resistor part can be increased. That is, a degree of freedom in designing the semiconductor device as the semiconductor circuit can be improved.

The electrical resistivity of the first region 241 of the first resistance control layer 240 may be equal to or higher than the electrical resistivity of the first electrode 231. Accordingly, when the first region and the first electrode have the same electrical resistivity, the first region and the first electrode can be simultaneously formed by the same process. Since types of interfaces at which different materials are in contact with each other between the first resistance control layer and the first electrode can be reduced, the occurrence of a defect such as separation between the first resistance control layer and the first electrode can be suppressed. When the electrical resistivity of the first region is higher than the electrical resistivity of the first electrode, the resistance value of the second resistor part can be increased. That is, a degree of freedom in designing the semiconductor device as the semiconductor circuit can be improved.

The electrical resistivity of the wiring part 150 may be equal to or higher than the electrical resistivity of the first electrode 131. Accordingly, in the semiconductor device, the influence of the wiring part on the resistance value of the resistor part can be suppressed.

In cross-sectional view cut so as to be perpendicular to the first main surface 110A of the semiconductor substrate 110 and include a central portion of the first region 141 of the first resistance control layer 140, the width W1 of the first region 141 in the direction parallel to the first main surface 110A may be larger than the thickness T1 of the first region 141 in the direction perpendicular to the first main surface 110A. Accordingly, it is possible to suppress the occurrence of the defect in the first resistance control layer when the first region is formed. The stability of the shape of the first region can be improved, and the electrical resistivity of the first region in a thickness direction can be uniform. That is, it is possible to suppress the fluctuation of the resistance value of the second resistor part.

The second region 142 of the first resistance control layer 140 may be formed by an insulator. Accordingly, it is possible to suppress the conduction of the second region between the first electrode and the wiring part. That is, the influence of the electrical resistivity and the dimension of the first region on the resistance value of the second resistor part can be increased.

The first electrode 331 may be formed by silicon, and the second region 342 of the first resistance control layer 340 may be formed by a silicon oxide. Accordingly, a process of manufacturing the semiconductor device can be simplified, and the manufacturing cost can be reduced. The first region 141 and the second region 142 of the first resistance control layer 140 may be formed by a semiconductor. Accordingly, the first region and the second region can be formed by decreasing or increasing the resistance of a part of the semiconductor. At this time, the first resistance control layer can be formed such that the first region and the second region have the same thickness. Since the fluctuation of the dimension of the first region can be suppressed, the fluctuation of the resistance value of the second resistor part can be suppressed. It is possible to suppress the occurrence of the defect such as separation between the first region and the second region.

The semiconductor substrate 110 may be formed by silicon. Accordingly, the semiconductor substrate can be manufactured at a lower cost than when the semiconductor substrate is formed by another semiconductor material.

The electrical resistivity of the semiconductor substrate 110 may be $10^{-4}$ Ω·cm or more and $10^{-2}$ Ω·cm or less. The electrical resistivity of the semiconductor substrate is set to $10^{-2}$ Ω·cm or less, and thus, the temperature dependence of mobility can be reduced. That is, a temperature change in characteristics of the semiconductor device as the semiconductor circuit can be suppressed. The semiconductor substrate can function as the semiconductor instead of the conductor by setting the electrical resistivity to $10^{-4}$ Ω·cm or more. That is, the semiconductor substrate can function as the first resistor part.

The trench structure 511 including at least one trench portion 510C may be formed so as to extend from the first main surface 510A into the semiconductor substrate 510, and the dielectric layer 520 and the first electrode 531 may be formed along the trench structure 511. Accordingly, in the semiconductor device, the electrostatic capacitance of the capacitor part can be increased.

When the first main surface 510A of the semiconductor substrate 510 is viewed in plan view, the first region 541 of the first resistance control layer 540 may be formed outside at least one trench portion 510C of the trench structure 511. Accordingly, it is possible to suppress the internal stress caused by the first resistance control layer and the wiring part from being concentrated at the corner of the trench portion. Therefore, in the semiconductor device, the damage of the dielectric layer can be suppressed.

The semiconductor device further includes a second resistance control layer 660 formed between the semiconductor substrate 610 and the second electrode 632, and the second resistance control layer 660 may include a third region 661 that electrically connects the semiconductor substrate 610 to the second electrode 632, and a fourth region 662 that is aligned with the third region 661 and has an electrical resistivity higher than an electrical resistivity of the third region 661. Accordingly, the semiconductor device can be the semiconductor circuit that causes the second resistance control layer to function as the third resistor part. In the semiconductor device, the resistance value of the third resistor part can be changed depending on the electrical resistivity and the dimension of the third region of the second resistance control layer. That is, in the semiconductor device, the combination of the element values of the capacitor part and the resistor part can be suitably changed. In other words, a degree of freedom in designing the semiconductor device as the semiconductor circuit can be improved.

The electrical resistivity of the third region 761 of the second resistance control layer 760 may be equal to or higher than the electrical resistivity of the second electrode 732. Accordingly, when the third region and the second electrode have the same electrical resistivity, the third region and the second electrode can be simultaneously formed by the same process. That is, the manufacturing process of the semiconductor device can be simplified, and the manufacturing cost can be reduced. Since types of interfaces at which different materials are in contact with each other between the second resistance control layer and the second electrode can be reduced, the occurrence of a defect such as separation between the second resistance control layer and the second electrode can be suppressed. When the electrical resistivity of the third region is higher than the electrical resistivity of the second electrode, the resistance value of the third resistor part can be increased. That is, a degree of freedom in designing the semiconductor device as the semiconductor circuit can be improved.

The electrical resistivity of the third region 761 of the second resistance control layer 760 may be equal to or higher than the electrical resistivity of the semiconductor substrate 710. Accordingly, when the third region and the semiconductor substrate have the same electrical resistivity, the third region and the semiconductor substrate can be simultaneously formed by the same process. Since types of interfaces at which different materials are in contact with each other between the second resistance control layer and the semiconductor substrate can be reduced, the occurrence of a defect such as separation between the second resistance control layer and the semiconductor substrate can be suppressed. When the electrical resistivity of the third region is higher than the electrical resistivity of the semiconductor substrate, the resistance value of the third resistor part can be increased. That is, a degree of freedom in designing the semiconductor device as the semiconductor circuit can be improved.

The electrical resistivity of the semiconductor substrate 610 may be equal to or higher than the electrical resistivity of the second electrode 632. Accordingly, in the semiconductor device, the influence of the second electrode on the resistance value of the resistor part can be suppressed.

In cross-sectional view cut so as to be perpendicular to the second main surface 610B of the semiconductor substrate 610 and include a central portion of the third region 661 of the second resistance control layer 660, the width W2 of the third region 661 in the direction parallel to the second main surface 610B may be larger than the thickness T2 of the third region 661 in the direction perpendicular to the second main surface 610B. Accordingly, it is possible to suppress the occurrence of the defect in the second resistance control layer when the third region is formed. The stability of the shape of the third region can be improved, and the electrical resistivity of the third region in a thickness direction can be uniform. That is, it is possible to suppress the fluctuation of the resistance value of the third resistor part.

The fourth region 662 of the second resistance control layer 660 may be formed by an insulator. Accordingly, it is possible to suppress the conduction of the fourth region between the semiconductor substrate and the second electrode. That is, the influence of the electrical resistivity and the dimension of the third region on the resistance value of the third resistor part can be increased.

The fourth region 862 of the second resistance control layer 860 may be provided by a silicon oxide. Accordingly, when the semiconductor substrate is formed by the silicon substrate, the fourth region can be formed by the thermal oxidation of the semiconductor substrate. That is, the manufacturing process of the semiconductor device can be simplified, and the manufacturing cost can be reduced.

The third region 661 and the fourth region 662 of the second resistance control layer 660 may be formed by a semiconductor. Accordingly, the third region and the fourth region can be formed by decreasing or increasing the resistance of a part of the semiconductor. At this time, the second resistance control layer can be formed such that the third region and the fourth region have the same thickness. Since the fluctuation of the dimension of the third region can be suppressed, the fluctuation of the resistance value of the third resistor part can be suppressed. It is possible to suppress the occurrence of the defect such as separation between the third region and the fourth region.

The wiring part 1050 may be patterned to form an inductor. Accordingly, the semiconductor device can be designed as an RLC circuit.

The semiconductor device 100 may be connected in parallel between a drain and a source or between a collector and an emitter of a transistor. Accordingly, the semiconductor device can be used as a snubber circuit. Even though the dimension of the semiconductor device is limited, the semiconductor device can be designed as the semiconductor circuit having a suitable electrostatic capacitance and resistance value as the snubber circuit.

As described above, according to the aspect of the present invention, it is possible to provide the semiconductor device capable of improving the degree of freedom in designing the circuit.

The aforementioned embodiments are intended to facilitate understanding of the present invention, and are not intended to limit and interpret the present invention. The present invention may be changed or modified without departing from the gist thereof, and the present invention also includes equivalents thereof. That is, the design changes appropriately changed by a person skilled in the art for each embodiment are included in the scope of the present invention as long as these design changes have the features of the present invention. For example, the components included in each embodiment and the arrangement, material, condition, shape, and size thereof are not limited to the illustrated examples, and can be appropriately changed. The components included in each embodiment can be combined as far as technically possible, and a combination of these components is also included in the scope of the present invention as long as the combination includes the features of the present invention.

DESCRIPTION OF REFERENCE SYMBOLS

100: semiconductor device
C: capacitor part
R, R1, R2: resistor part
110: semiconductor substrate
110A: first main surface
110B: second main surface
120: dielectric layer
131: first electrode
132: second electrode
140: resistance control layer (first resistance control layer)
141: low resistance region (first region)
142: high resistance region (second region)
150: wiring part
T1: thickness of low resistance region
W1: width of low resistance region

The invention claimed is:

1. A semiconductor device comprising:
a semiconductor substrate that has a first main surface and a second main surface;
a first electrode opposing the first main surface of the semiconductor substrate;
a dielectric layer between the semiconductor substrate and the first electrode;
a first resistance control layer on the first electrode;
a wiring part on the first resistance control layer; and
a second electrode opposing the second main surface of the semiconductor substrate,
wherein the first resistance control layer includes a first region that has a first electrical resistivity and that electrically connects the first electrode and the wiring part, and a second region that is aligned with the first region and has a second electrical resistivity higher than the first electrical resistivity of the first region.

2. The semiconductor device according to claim 1, wherein the first electrical resistivity of the first region is equal to or higher than a third electrical resistivity of the wiring part.

3. The semiconductor device according to claim 1, wherein the first electrical resistivity of the first region is equal to or higher than a third electrical resistivity of the first electrode.

4. The semiconductor device according to claim 1, wherein a third electrical resistivity of the wiring part is equal to or higher than a fourth electrical resistivity of the first electrode.

5. The semiconductor device according to claim 1, wherein, in a cross-sectional view perpendicular to the first main surface of the semiconductor substrate through a central portion of the first region of the first resistance control layer, a width of the first region in a direction parallel to the first main surface is larger than a thickness of the first region in a direction perpendicular to the first main surface.

6. The semiconductor device according to claim 1, wherein the second region of the first resistance control layer is an insulator.

7. The semiconductor device according to claim 6, wherein the first electrode comprises silicon, and the second region of the first resistance control layer comprises a silicon oxide.

8. The semiconductor device according to claim 1, wherein the first region and the second region of the first resistance control layer comprise a semiconductor.

9. The semiconductor device according to claim 1, wherein the semiconductor substrate comprises silicon.

10. The semiconductor device according to claim 9, wherein a third electrical resistivity of the semiconductor substrate is $10^{-4}$ Ω·cm to $10^{-2}$ Ω·cm.

11. The semiconductor device according to claim 1, further comprising:

a trench structure including at least one trench portion extending into the semiconductor substrate from the first main surface of the semiconductor substrate, wherein the dielectric layer and the first electrode extend along the trench structure.

12. The semiconductor device according to claim 11, wherein the first region of the first resistance control layer is outside the at least one trench portion of the trench structure when viewed in a plan view of the semiconductor device.

13. The semiconductor device according to claim 1, further comprising:

a second resistance control layer between the semiconductor substrate and the second electrode, wherein the second resistance control layer includes a third region that has a third electrical resistivity and that electrically connects the semiconductor substrate and the second electrode, and a fourth region that is aligned with the third region and has a fourth electrical resistivity higher than the third electrical resistivity of the third region.

14. The semiconductor device according to claim 13, wherein the third electrical resistivity of the third region of the second resistance control layer is equal to or higher than a fifth electrical resistivity of the second electrode.

15. The semiconductor device according to claim 13, wherein the third electrical resistivity of the third region of the second resistance control layer is equal to or higher than a fifth electrical resistivity of the semiconductor substrate.

16. The semiconductor device according to claim 13, wherein a fifth electrical resistivity of the semiconductor substrate is equal to or higher than a sixth electrical resistivity of the second electrode.

17. The semiconductor device according to claim 13, wherein, in a cross-sectional view perpendicular to the second main surface of the semiconductor substrate through a central portion of the third region of the second resistance control layer, a width of the third region in a direction parallel to the second main surface is larger than a thickness of the third region in a direction perpendicular to the second main surface.

18. The semiconductor device according to claim 13, wherein the fourth region of the second resistance control layer is an insulator.

19. The semiconductor device according to claim 18, wherein the fourth region of the second resistance control layer comprises a silicon oxide.

20. The semiconductor device according to claim 13, wherein the third region and the fourth region of the second resistance control layer comprise a semiconductor.

21. The semiconductor device according to claim 1, wherein the wiring part is patterned as an inductor.

22. A circuit comprising the semiconductor device according to claim 1 connected in parallel between a drain and a source or between a collector and an emitter of a transistor.

* * * * *